United States Patent [19]

Lund et al.

[11] Patent Number: 4,503,451
[45] Date of Patent: Mar. 5, 1985

[54] LOW RESISTANCE BURIED POWER BUS FOR INTEGRATED CIRCUITS

[75] Inventors: Clarence A. Lund, Phoenix; Michael D. Sugino, Mesa, both of Ariz.

[73] Assignee: Motorola, Inc., Schaumburg, Ill.

[21] Appl. No.: 404,264

[22] Filed: Jul. 30, 1982

[51] Int. Cl.³ ...................... H01L 23/52; H01L 27/04
[52] U.S. Cl. .................... 357/50; 357/23.11; 357/42; 357/55; 357/65
[58] Field of Search ................. 357/50, 23 CS, 42, 55, 357/65, 67 S

[56] References Cited

U.S. PATENT DOCUMENTS

| | | | |
|---|---|---|---|
| 3,913,124 | 10/1975 | Roberson | 357/50 |
| 4,037,306 | 7/1977 | Gutteridge et al. | 357/50 |
| 4,048,649 | 9/1977 | Bohn | 357/50 |
| 4,140,558 | 2/1979 | Murphy et al. | 357/50 |
| 4,280,272 | 7/1981 | Egawa et al. | 357/42 |
| 4,329,772 | 5/1982 | Oikawa et al. | 357/22 |
| 4,338,618 | 7/1982 | Nishizawa | 357/22 |
| 4,339,869 | 7/1982 | Reihl et al. | 357/65 |
| 4,369,565 | 1/1983 | Muramatsu | 357/50 |
| 4,435,896 | 3/1984 | Parrillo et al. | 357/42 |

FOREIGN PATENT DOCUMENTS

| | | | |
|---|---|---|---|
| 57126 | 8/1982 | European Pat. Off. | 357/55 |
| 154979 | 12/1979 | Japan | 357/23 CS |
| 21858 | 2/1982 | Japan | 357/65 |

*Primary Examiner*—William D. Larkins
*Assistant Examiner*—Charles S. Small, Jr.
*Attorney, Agent, or Firm*—John A. Fisher

[57] ABSTRACT

In a channel formed in one surface of a semiconductor substrate having a first conductivity, e.g. N type, a layer of material having a second conductivity type, e.g. P type boron, and a layer of relatively low resistance material such as Tungsten in contact with the first layer but insulated from the substrate. Second conductivity type tubs and the like can be formed adjacent the bus and in direct contact therewith through the first layer.

7 Claims, 6 Drawing Figures

LOW RESISTANCE BURIED POWER BUS FOR INTEGRATED CIRCUITS

BACKGROUND OF THE INVENTION

In the construction of IC circuits and the like on semiconductor substrates, the surface of the substrate is generally overcrowded with metal and the like used in forming components, interconnections, etc. Because of the extreme crowding and proximity of the various components, great care must be used in placing interconnecting buses and the like on the substrate.

SUMMARY OF THE INVENTION

The present invention pertains to a low resistance buried power bus for integrated circuits and the like wherein the semiconductor substrate has one or more channels formed in the surface thereof with a layer of low resistance material deposited in the channel and insulated from the substrate to relieve crowding on the surface.

In the preferred embodiment the substrate is of a first conductivity type and the channel has a layer of material of a second conductivity type positioned therein prior to the layer of low resistance material to form a junction with the substrate at the bottom of the channel for contacting the low resistance material through the first layer of material with components of similar conductivity type.

It is an object of the present invention to provide a new and improved low resistance buried power bus for integrated circuits.

It is a further object of the present invention to provide a low resistance buried power bus for integrated circuits a portion of which forms a reverse junction with the substrate for contacting certain conductivity type components directly and insulating the remaining components from the bus.

These and other objects will become apparent to those skilled in the art upon consideration of the accompanying specification, claims and drawings.

BRIEF DESCRIPTION OF THE DRAWINGS

Referring to the drawings, wherein like characters indicate like parts throughout the FIGS..

DESCRIPTION OF THE PREFERRED EMBODIMENT

One embodiment of the process for the fabrication of low resistance buried power buses in accordance with the invention, as well as the apparatus embodying the invention is illustrated by the following description. Referring to the FIGS., a cross-section of a substrate 10 composed of N-type silicon is illustrated. It will be understood by those skilled in the art that the process and apparatus are equally applicable to either N or P-type substrates, but will here be illustrated by describing the process for an N-type substrate. The N-type silicon substrate 10 has a plurality of channels 12 formed therein by any convenient means, such as etching or the like. "Channels" as used herein refers to a slot or aperture and should be differentiated from a "channel region" of an MOS device. It should be noted by those skilled in the field of integrated circuit manufacture that in many instances channels are already formed in the surface of a substrate to provide a barrier or spacing between adjacent components, circuits, etc. and inhibit interaction therebetween. In many instances, these channels can be used for the present invention and will further reduce surface crowding.

Figure 1:
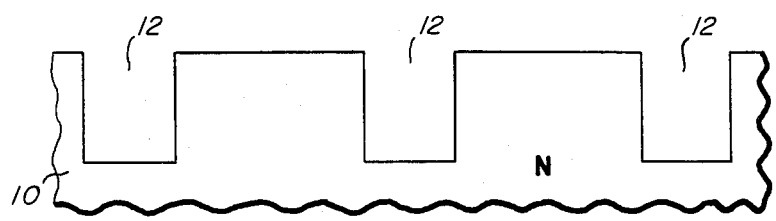
FIGS. 1-6 depict in cross-section the steps employed in fabricating low resistance buried power buses in accordance with the invention.
Figure 2:
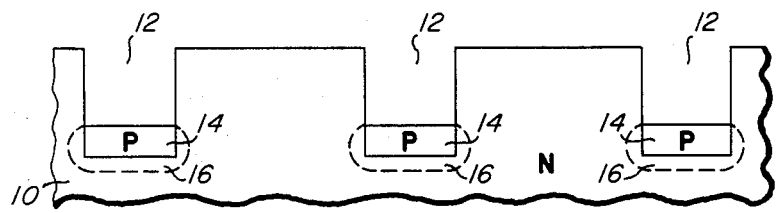

Referring specifically to FIG. 2, a first layer of material 14 is formed at the bottom of the channel 12. In the present embodiment where the substrate 10 is formed of N-type silicon the layer of material 14 is formed of a P-type material, such as boron, aluminum, etc. The material in the layer 14 is diffused into the surrounding silicon to form an out diffusion area 16 generally around the bottom of each of the channels 12. The diffusion area 16 forms a reverse P-N junction with the surrounding N-type silicon substrate. It should be understood that while the diffused material at the bottom of channel 12 is illustrated as a layer 14 of P-type materials, it is actually a layer diffused into the substrate by methods well known to those skilled in the art. For convenience of illustration and understanding this area is depicted as a layer 14 and a diffusion area 16 whereas in actuality this is simply a diffused area of P-type material that forms a P-N junction. The layer 14 and diffused area 16 will be referred to as a diffused layer for convenience. The purpose of the P-N junction is to form a reverse junction with the substrate 10 and, thereby, prevent any conduction from IC components through the substrate 10 to the bus. A further purpose is to make contact with adjacent components having P-type parts in contact with the diffused area 16, as will be explained presently. If it is desired to make contact in some other fashion, such as by surface metal, the first layer 14 and diffused area 16 can be eliminated and an insulating material can be placed in the bottom of the channel.

Figure 3:
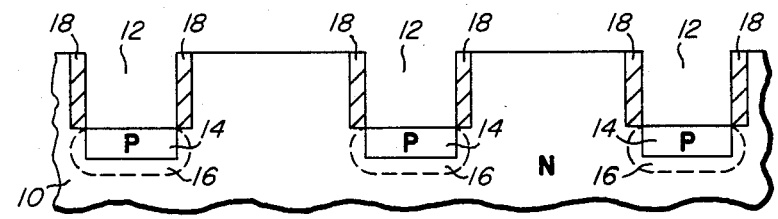

Referring to FIG. 3, once the layer 14 of P-type material is formed and diffused in the bottom of the channel 12 the sides of the channel 12 are treated to form a layer 18, on each side of the channel 12, of silicon oxide, silicon nitride, or the like. It will be apparent that these steps may be reversed in some processes. In connection with the elimination of the layer 14, as described above, it will be apparent to those skilled in the art that the insulating layer 18 could be formed along the bottom of the channel 12 as well as the sides. The layer 18 on either side of the channel 12 is an insulating layer to insulate the surrounding substrate 10 from the channel 12.

Figure 4:
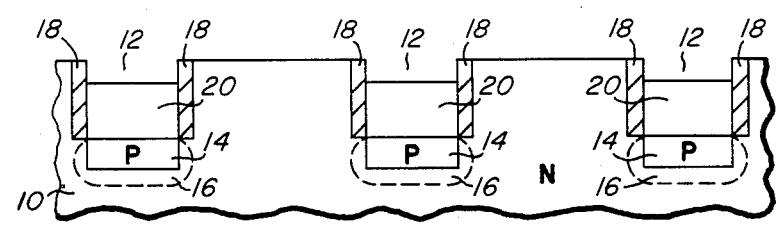
Figure 5:
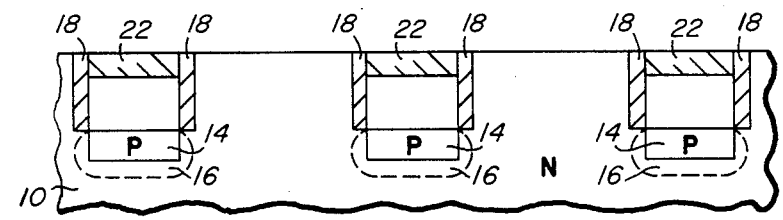

Referring specifically to FIG. 4, a layer 20 of relatively low resistance material, such as tungsten or molybdenum which can be selectively deposited on silicon is formed in the channels 12. The layer 20 is the power bus which carries current and, depending upon connections to be made thereto, the layer 20 may be deposited to partially fill the channels 12, as illustrated in FIG. 4, or may completely fill the channel 12 to the upper edge thereof. If external connections, at the upper surface of the substrate 10 are to be made to the layer 20, then it may be convenient to completely fill the channel 12 with the low resistance material. If contact is to be made to the layer 20 through a P-N junction at the bottom of the channel, as in this embodiment, the channel 12 is only partially filled. Then, as illustrated in FIG. 5, a layer 22 of insulating material is formed in the channel 12 above the layer 20 to completely fill the channel and insulate the current conducting layer 20 from metal deposits that may be formed on the surface of the substrate 10. In this fashion some overcrowding at the surface of the substrate 10 can be relieved by plating metal over the insulating layer 22 in channel 12 for additional conservation of space. The low resistance material layer 20 operates as a buried power bus and, in some instances, the channel 12 still operates as a barrier between components or circuits.

Figure 6:
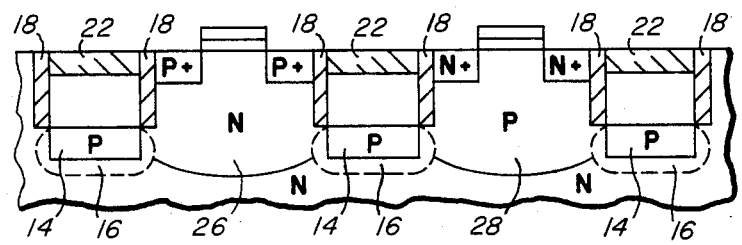

With the completion of the buried power bus (FIG. 5) the process of forming an IC circuit in the substrate 10 can be continued. As illustrated in FIG. 6, for example, N-type tubs 26 and P-type tubs 28 are implanted in the exposed silicon between buried power buses. The N-type tub 26 is contacted from the opposite surface of the substrate 10. One method of enhancing this contact is to build the substrate on an epi layer and use it for one bus. The P-type tub 28 is in contact with the buses immediately adjacent thereto through the diffusion layers depicted as area 16 and layer 14 herein.

Thus, a low resistance buried power bus and method of manufacturing the bus are disclosed and illustrated herein. The buried power bus reduces the amount of metal required at the surface of the substrate and provides additional area for components and the like. Further, the buried power bus provides convenient contact to components and may, in some instances, be incorporated into channels formed in the surface of the substrate for purposes of segregating components for areas. If incorporated in channels formed for segregating purposes, the buried bus will still operate as a barrier to interaction between adjacent components.

In the event that the substrate 10 is formed of P-type material the only change to the above embodiment will be to form and diffuse N-type material at the bottom of the channels. Typical N-type material to be diffused at the bottom of the channels would be phosphorous, arsenic, etc. Thus, N-type tubs and component parts would be in direct contact with the buried power bus while P-type tubs and component parts would be contacted from the opposite side of the substrate.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. An integrated circuit structure including a low resistance buried power bus comprising: a semiconductor substrate of a first conductivity type having first and second surfaces and defining in said first surface a channel having a bottom and sides; a first diffused layer including material of a second conductivity type diffused in said bottom of said channel; said sides of said channel being treated to form a layer of insulating material therealong between said substrate and said channel; a second layer of metal deposited in said channel in contact with said first diffused layer and insulated from said substrate by said layer of insulating material; and tubs of said first and said second types of conductivity formed in said substrate adjacent said channel with said tubs of said first type of conductivity being electrically contacted from said second surface of said substrate and said tubs of said second type of conductivity being in electrical contact with said second layer of metal through said first diffused layer of material.

2. An integrated circuit structure as claimed in claim 1 wherein said second layer of metal comprises molybdenum.

3. An integrated circuit structure as claimed in claim 1 wherein said semiconductor substrate is N type conductivity and said first diffused layer of material is P type conductivity.

4. An integrated circuit structure as claimed in claim 3 wherein said first diffused layer of material is boron and said second layer of metal is tungsten.

5. An integrated circuit structure as claimed in claim 1 including in addition a third layer of insulating material in said channel overlying said second layer.

6. An integrated circuit structure as claimed in claim 5 wherein said layer of insulating material along said sides of said channel and said third layer include silicon nitride.

7. An integrated circuit structure as claimed in claim 5 wherein said second layer and said third layer substantially fill said channel.

* * * * *